US00RE39017E

(19) United States
(12) Reissued Patent
Smallcomb et al.

(10) Patent Number: US RE39,017 E
(45) Date of Reissued Patent: Mar. 14, 2006

(54) INTERNET UPSTREAM REQUEST COMPRESSION

(75) Inventors: Joseph Smallcomb, Boca Raton, FL (US); Ray Allen Daniel, Lynwood, WA (US)

(73) Assignee: ITT Manufacturing Enterprises, Inc., Wilmington, DE (US)

(21) Appl. No.: 09/927,778

(22) Filed: Aug. 15, 2001

Related U.S. Patent Documents

Reissue of:
(64) Patent No.: 5,938,737
Issued: Aug. 17, 1999
Appl. No.: 08/799,352
Filed: Feb. 14, 1997

(51) Int. Cl.
*G06F 15/16* (2006.01)

(52) U.S. Cl. ..... 709/247; 709/217; 370/352
(58) Field of Classification Search ..... 709/246, 709/247, 217; 370/473, 401, 392, 230, 352; 341/51, 65
See application file for complete search history.

(56) References Cited

U.S. PATENT DOCUMENTS 5,136,291 A * 8/1992 Teague ..... 341/83
5,307,413 A * 4/1994 Denzer ..... 370/473
5,534,913 A * 7/1996 Majeti et al. ..... 725/114
5,535,199 A * 7/1996 Amri et al. ..... 370/392
5,555,377 A * 9/1996 Christensen et al. ..... 709/247
5,557,749 A * 9/1996 Norris ..... 709/228
5,627,829 A * 5/1997 Gleeson et al. ..... 370/230
5,668,737 A * 9/1997 Iler ..... 341/65
5,673,322 A * 9/1997 Pepe et al. ..... 705/52
5,673,392 A * 9/1997 Nakashima et al. ..... 708/203
5,732,216 A * 3/1998 Logan et al. ..... 709/203
5,732,219 A * 3/1998 Blumer et al. ..... 709/227
5,742,773 A * 4/1998 Blomfield-Brown et al. .... 709/228
5,867,112 A * 2/1999 Kost ..... 341/51
6,115,384 A * 9/2000 Parzych ..... 370/401

* cited by examiner

*Primary Examiner*—Le Hien Luu
(74) *Attorney, Agent, or Firm*—Edell, Shapiro & Finnan, LLC

(57) ABSTRACT

Interactive internet activities are a very popular means for gathering information for business, personal, medical, entertainment and other purposes. Most internet interaction is asymmetrical in nature in that a client's requests for information are much smaller (in data size) than the resulting information delivered by the server. Although the client/internet link is inherently asymmetrical, there remains a great deal of interaction and overhead required between the client and the server that increases the bandwidth needs for the client's upstream request channel. There are many advantages to reducing this upstream traffic volume and thereby making the internet interaction even more asymmetrical. Such compression of request data could allow more clients to utilize a single upstream data path instead of separate paths.

57 Claims, 2 Drawing Sheets

INTERNET UPSTREAM REQUEST COMPRESSION

Matter enclosed in heavy brackets [ ] appears in the original patent but forms no part of this reissue specification; matter printed in italics indicates the additions made by reissue.

TECHNICAL FIELD

This invention relates to interactive information requests over the internet.

BACKGROUND ART

To gain access to the internet, a client (user) will typically login into an Internet Service Provider (ISP) via a telephone or ISDN modem. This connection is typically a medium data rate (i.e., 9.6 to 28.8 kbps), symmetrical connection. However, the client is typically searching for information, which leads to asymmetric communications. For example, a client (user) requesting a file download will send a small upstream request (e.g., 200 bytes) but receive a large file (e.g. 200 kbytes) in return from the server. In these types of connection the downstream channel (i.e., return link) is the bottleneck.

The typical volume of downstream data to upstream data ratio is from 10:1 to 20:1. Currently, asymmetrical channel services are being deployed (e.g., satellite broadcast, cable modems, ADSL, etc.) to take advantage of this ratio and reduce this downstream bottleneck. These services typically increase the downstream channel capacity by using a media with wider bandwidth (e.g., co-axial cable), and maintain or allocate a smaller bandwidth connection for the upstream user request channel. In some cases (such as satellite broadcast), an upstream channel path, independent of the downstream channel path, is utilized.

The Internet is a packet switch network, where the defacto protocol standard is TCP/IP. The Internet Protocol (IP) provides the basic addressing scheme for internet routing (where the information goes). Transmission Control Protocol (TCP) is very robust protocol designed for error-free bulk data transfer and error detection and correction. On top of TCP/IP, an additional serial interface, protocol (e.g., PPP or SLIP) is used for connection with an ISP. From the standpoint of upstream channel efficiency, a typical internet request has a high degree of packet overhead to accommodate the layers of protocol, the error correction, and the data coding scheme.

Browsing on the World Wide Web (WWW) (one of the most popular activities on the internet) also leads to inefficient use of the upstream channel. This browsing is based on the HyperText Transfer Protocol (HTTP). Typically, a user sends an HTTP request for a Web Page to a particular server on the internet and the server responds with requested information. This transaction takes several phases (i.e., Connect, Request, Response, Close) to complete. In addition, the requested information from the server is most commonly an HTTP file which references graphical images, audio files, and/or additional text. The browser will then automatically request the additional information (unless the user has manually selected to filter out certain high bandwidth file requests from being made). It is not uncommon for an initial request of a web page to trigger 20 more requests which are required to complete the transaction and build the image seen through the browser.

THE PRESENT INVENTION

Although the implementation of asymmetrical internet connections has made internet interaction more efficient, there is yet more compression that can occur to make the upstream channel even more compact.

In this invention, the upstream traffic between the Client and the Upstream Gateway is compressed and reduced with the bulk of the internet communication performed at the Upstream and (in some cases) Downstream Gateway. This allows more users to be placed on multiple access upstream channels and/or reduce the user cost on a charge-by-the-byte upstream channel. This invention exploits the architecture of the Indirect Network Connection that is utilized in an asymmetrical internet connection as well as the characteristic that the upstream channel from the Client to the Upstream Gateway is a point-to-point connection.

This invention utilizes four types of compression to reduce upstream channel traffic so that the ratio of downstream to upstream channel traffic is increased significantly beyond the 20:1 ratio that is now experienced:

(1) Format compression of request packets.

The typical browser request contains ASCII symbols with characters and patterns that are commonly repeated. For example, in the request:

http://www.cnn.com/SPORTS/FOOTBALL/college/96/news.usa-rate.html

"/" and "." are the most common characters. Patterns like "http://", "www", ".com", and ".html" are also common. A simple statistical compression or linear predication scheme could reduce the number of bytes required for a request and would be appropriate for this real-time compression application.

Software running at the Client site could operate beneath the browser to compress the ASCII text requests prior to their TCP/IP formatting and the full, uncompressed, request would be regenerated at the Upstream Gateway.

(2) Perform TCP and IP packetizinq at the Upstream Gateway rather than at the Client:

Since the upstream channel between the Client and the Upstream Gateway is a point-to-point link, the packet overhead of TCP and IP are not necessarily required. Software running at the Client site would operate beneath the browser to bypass the TCP/IP packet formation after the initial connection is established. The Upstream Gateway would then take the requests and add the TCP/IP overhead prior to transmission to the Internet.

(3) Keep a User Profile at the Upstream Gateway:

A large database could be implemented at the Upstream Gateway which stores a Client's previous data requests. Software running at the Client site would operate beneath the browser to send a short address reference message to the Upstream Gateway to indicate a previously requested site instead of sending an entire request sequence. The Upstream Gateway, in turn, would look up the short address reference in the database for that Client in order to send out the complete data request to the Internet. This could be implemented with a "Go back "N" requests" scheme or a Bookmark scheme similar to those on a typical browser.

(4) Automatically generate additional HTTP requests:

The fact that a single web page likely requires multiple data requests from the Client is the largest contributor to upstream data traffic. Instead of the Client system sending the automatic subsequent requests for additional data (referenced by the initial HTTP file delivered from the Server), the gateways could be programmed to receive the first request response from a server and automatically make all of the subsequent file requests for the Client. Each of the requested files would then be downloaded to the Client on the downstream channel as they are received. This makes it possible to have only one data request to be sent by the Client on the upstream channel (instead of a multitude) to assemble a web page.

In addition to the higher HTTP level compression, the gateways could also handle the lower HTTP level of connection, request, response, and close messages with the Internet so that the Client would not be required to send all of these separate messages on the upstream channel.

The Upstream and Downstream Gateways could operate in concert for this service, or they could operate independently with one gateway or the other managing the proxy requests.

Software running at the Client site would operate beneath the browser to manage these compression functions. In addition, should the Client wish to filter out the request of certain files (e.g. to speed up their internet session or to reduce downstream bandwidth), the compression management software could send a message to the gateways to indicate this and only the desired files would be automatically requested by the gateways.

BRIEF DESCRIPTION OF THE DRAWINGS

The above and other objects, advantages and features of the invention will become more clear when considered with the following description and accompanying drawings, wherein.

DETAILED DESCRIPTION OF THE INVENTION

Figure 1:
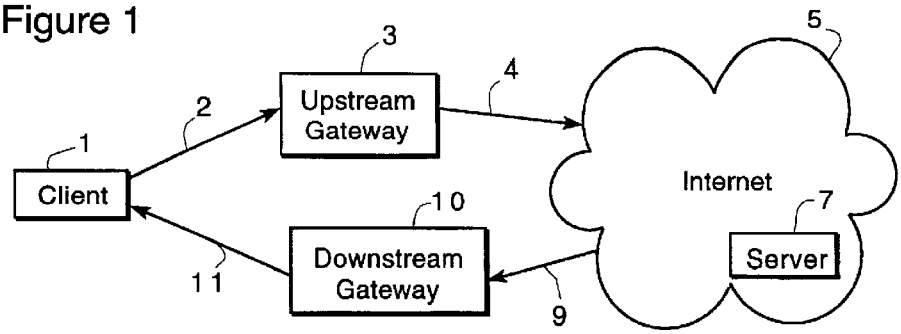
FIG. 1 (prior art) is a diagrammatic illustration of a typical indirect internet connection.
Figure 2:
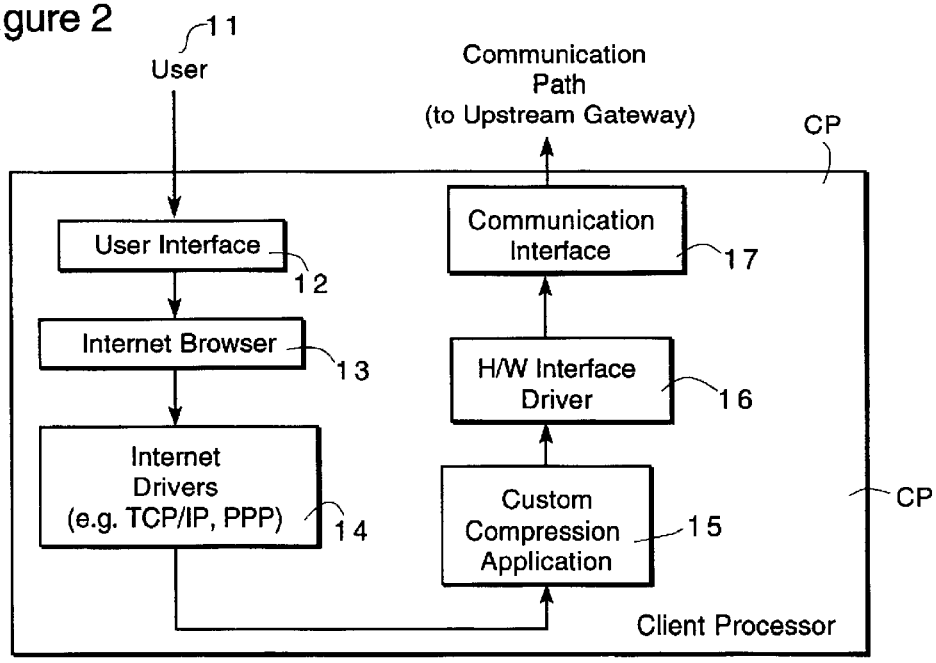
FIG. 2 is a block diagram of the client processor for internet browsing with a compressed upstream channel.

FIG. 1 illustrates all the basic elements of an Indirect Internet Connection where the upstream and downstream data paths are asymmetric and different in their implementation. A Client (i.e., user) (1) requests information from a Server 7 (e.g., home page) somewhere on the internet. It sends the request on the Upstream Channel (2) to the Upstream Gateway. The Upstream Gateway forwards the request onto the Internet (5) over a higher speed link (4) and it eventually arrives at the addressed server (7). Server 7 responds to the request by addressing the Downstream Gateway (10) and the Client (1). The response arrives at the Downstream Gateway 10 from the Internet (5) over a high speed link (9) and the Downstream Gateway forwards the request to the Client over the Downstream Channel (11). (In most internet service configurations, the two gateways are typically co-located (e.g., dial-up ISP, cable headend, etc.), but it is also possible for the two gateways (and associated upstream and downstream paths) to be separate and independent (e.g., satellite broadcast downstream, telephone line upstream).) FIG. 2 shows an exploded view of the Client Processor CP and the relevant elements that would be needed for internet web browsing with a compressed upstream channel (for simplicity, only the upstream path is shown) according to the invention. The User (11) initiates an information request to the Internet Browser (13) through the User Interface (12) (e.g., a query to a web page). The Internet Browser (13) sends a request message to the appropriate drivers (e.g. TCP/IP, PPP, SLP) of the operating system (e.g. Windows 95, Solaris, MacOS) where the request message is formatted for transportation to and on the internet. For the Internet Drivers (14), the Custom Compression Application (15) (the subject of this invention) intercepts the request message and performs the appropriate compression techniques (explained below) prior to delivery to the H/W Interface Driver (16), Communication Interface (17) and the Communication Path (18) for transmission to the Upstream Gateway (23) (FIG. 3), where the request message decompression takes place.

Figure 3:
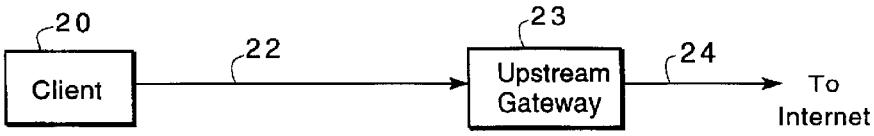
FIG. 3 is a block diagram illustrating a first compression technique incorporated in the invention.

FIG. 3 shows a description of the first compression technique where the ASCII message format is compressed. A software application will run on the Client (20), "below" the internet browser, so that all messages sent from the browser will pass through the compression software and the ASCII text strings will be reduced by efficiently coding the repeating or redundant characters real-time or near real-time (using a simple statistical compression or linear predication scheme), then passed on to the drivers that transmit the message on the Communication Channel (12) to the Upstream Gateway (23). The complementary software running at the Upstream Gateway (23) receives the messages from the Communication Channel (22) and reconstructs the full ASCII text string prior to delivery to transmission on the Communication Channel (24) to the Internet.

Figure 4:
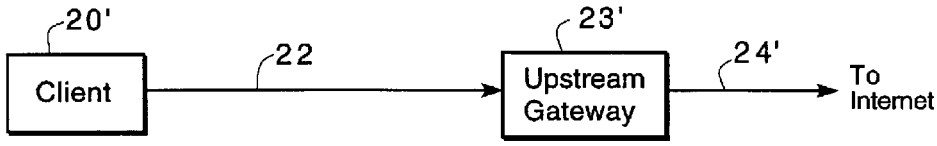
FIG. 4 is a block diagram of a second compression technique incorporating the invention.

FIG. 4 shows a description of the second compression technique where the TCP and IP packetizing and overhead is added at the Upstream Gateway (23'). A software application will run on the Client (20'), "below" the internet browser, so that all messages sent from the browser will be intercepted by the compression software and the unnecessary TCP/IP overhead are not added. The complementary software running at the Upstream Gateway (23') receives the messages from the Communication Channel (22) and reads (then removes) the client ID so that the appropriate TCP/IP overhead can then be added prior to delivery to transmission on the Communication Channel (24) to the Internet.

Figure 5:
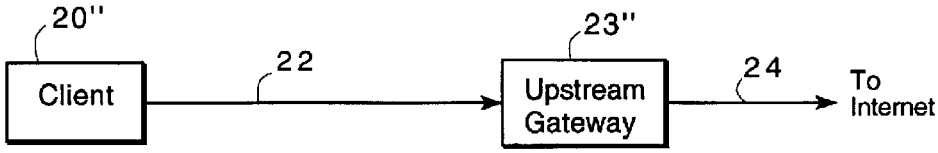
FIG. 5 is a block diagram illustrating a third compression technique incorporated in the invention.

FIG. 5 shows a description of the third compression technique where a short web address reference message is sent to the Upstream Gateway (23"). A software application will run on the Client (20"), "below" the internet browser, which follows the user's web browsing and notes frequently visited sites and also bookmarks that the user enters. The software can then exchange information with the Upstream Gateway (23") so that a web site address is stored in a user profile database, and referenced by the Client software by a short coded reference message from the Client (20") to the Upstream Gateway (23") instead of the complete web site address. In addition, the user could manually set up a number of sites that are to be referenced using this shortcut.

Figure 6:
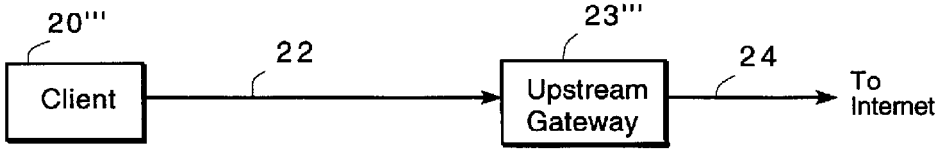
FIG. 6 is a block diagram illustrating a fourth compression technique incorporated in the invention.

FIG. 6 illustrates the fourth compression technique where the Upstream Gateway (23''') requests all additional web page graphics, images, etc. automatically. A software application will run on the Client (20'''), "below" the internet browser, so that the browser is inhibited from automatically requesting any subsequent graphics or image files that may be referenced in the initial web page HTML file response. Instead, when a web page is addressed for delivery by the Client (20'''), the Upstream Gateway (23''') will receive a copy of the initial web page HTML file and make all of the subsequent file requests for the Client (20''') thereby acting as an internet proxy for the Client (20'''). Should the user not wish for the subsequent files to be requested (e.g. in order to save downstream bandwidth), a setting could be sent from the Client (20'") to the Upstream Gateway (23'") which would set up the Upstream Gateway software to not make the requests.

FEATURES OF THE INVENTION

The upstream channel traffic from a Client can be significantly reduced, increasing the number of users on a multiple access upstream channel or reducing the required bandwidth for a single user. This is accomplished by:

1. Compressing the data between the Client and Upstream Gateway.
2. Having the Upstream Gateway perform protocol overhead functions.
3. Keeping a user profile at the Upstream Gateway.
4. Automatically generating new request at the gateway for the client.

One or more of these techniques may be used to "compress" data traffic on the upstream request channel.

While the invention has been described in relation to preferred embodiments of the invention, it will be appreciated that other embodiments, adaptations and modifications of the invention will be apparent to those skilled in the art.

What is claimed is:

1. In an interactive internet information distribution system in which user stations are connected to the internet by an internet server through an upstream gateway for transmission of information requests to said internet server and downstream gateways for transmission of information from the internet server to the user stations, the improvement wherein each user station includes a processor, said processor including:

(a) means for interfacing with the user, (b) an internet browser module connected to said interfacing means, (c) internet driver means connected to said internet browser means, (d) compression module connected to said internet driver means for reducing the upstream traffic whereby the ratio of downstream to upstream channel traffic is increased beyond a 20:1 ratio and wherein said upstream gateway includes means for storing a profile of the users connected thereto.

2. In an interactive internet information distribution system in which user stations are connected to the internet by an internet server through an upstream gateway for transmission of information requests to said internet server and downstream gateways for transmission of information from the internet server to the user stations, the improvement wherein each user station includes a processor, said processor including:

(a) means for interfacing with the user, (b) an internet browser module connected to said interfacing means, (c) internet driver means connected to said internet browser means, (d) compression module connected to said internet driver means for reducing the upstream traffic whereby the ratio of downstream to upstream channel traffic is increased beyond a 20:1 ratio and wherein said upstream gateway is adapted to perform protocol overhead functions and includes means for storing a profile of the users connected thereto.

3. In an interactive internet information distribution system in which user stations are connected to the internet by an internet server through an upstream gateway for transmission of information requests to said internet server and downstream gateways for transmission of information from the internet server to the user stations, the improvement wherein each user station includes a processor, said processor including:

(a) means for interfacing with the user, (b) an internet browser module, connected to said interfacing means, (c) internet driver means connected to said internet browser means, (d) compression module connected to said internet driver means for reducing the upstream traffic whereby the ratio of downstream to upstream channel traffic is increased beyond a 20:1 ratio and wherein said upstream gateway includes means for automatically generating a new data request for a given user.

4. The information distribution system defined in claim 2 wherein said upstream gateway includes means for automatically generating a new data request for a given user.

5. The information distribution system defined in claim 1 wherein said upstream gateway includes means for automatically generating a new data request for a given user.

*6. A method of reducing upstream request data from a client to request information from a server, the method comprising:*

*receiving an upstream request;*

*compressing the upstream request data using an internet driver, thereby generating a compressed upstream request; and*

*outputting the compressed upstream request using a connection-oriented communication protocol, wherein the compressed upstream request is output on an upstream channel and the requested information is received on a downstream channel having a substantially larger capacity than the upstream channel, wherein a ratio of downstream channel traffic to upstream channel traffic is increased beyond a 20:1 ratio.*

*7. The method of claim 6, wherein the upstream request is compressed using format compression.*

*8. The method of claim 7, wherein said format compression is a statistical compression.*

*9. The method of claim 7, wherein said format compression is a linear prediction compression.*

*10. The method of claim 6, wherein the upstream request is compressed by intercepting said upstream request prior to the addition of network communications protocol information, and generating the compressed upstream request that does not include network communications protocol information.*

*11. The method of claim 10, wherein said communications protocol is TCP/IP.*

*12. The method of claim 6, wherein the upstream request is compressed by replacing a previously used string with a short coded reference.*

*13. The method of claim 12, wherein said previously used string is a web site address.*

*14. The method of claim 6, further comprising reducing the number of subsequent upstream requests output from said client.*

*15. The method of claim 14, wherein said reducing the number of subsequent upstream requests is performed by inhibiting generation of automatic upstream requests based on embedded references contained within the information received in response to outputting the compressed upstream request.*

*16. The method of claim 14, wherein said client provides criteria to a gateway for generating requests based on the embedded references contained within the information received in response to outputting the compressed upstream request.*

*17. A method of reducing upstream request data from a client to request information from a server, the method comprising:*

*receiving a compressed upstream request according to a connection-oriented communication protocol, the compressed upstream request being compressed using an internet driver, wherein a ratio of downstream channel traffic to upstream channel traffic exceeds a ratio of 20:1;*

*decompressing said compressed upstream request to reconstruct an upstream request from the client;*

*outputting the upstream request upon a communications network; and*

*automatically generating a new data request for a given user.*

*18. The method of claim 17, wherein the compressed upstream request is decompressed using format decompression.*

*19. The method of claim 18, wherein said format decompression is a statistical decompression.*

*20. The method of claim 18, wherein said format decompression is a linear prediction decompression.*

*21. The method of claim 17, wherein the compressed upstream request is decompressed by adding network communications protocol information to the compressed upstream request.*

*22. The method of claim 21, wherein said communications protocol is TCP/IP.*

*23. The method of claim 17, wherein the compressed upstream request is decompressed by replacing a short coded reference within the compressed upstream request with a predetermined string.*

*24. The method of claim 23, wherein said predetermined string is a web site address contained in a previously received upstream request.*

*25. The method of claim 17, further comprising:*

*receiving the information from the server in response to outputting the upstream request;*

*generating a request for additional information based on a reference identified within the received information;*

*outputting the generated request upon said communications network.*

*26. The method as defined in claim 25, wherein said upstream request is an HTTP request for a web page, the information received from the server is the requested web page, and the additional information is a file referenced by the web page.*

*27. The method of claim 26, wherein generating the request for the file referenced by the web page is controlled by criteria provided by said client.*

*28. The method of claim 17, wherein said decompressing is performed by an upstream gateway having stored therein a profile of users connected to the upstream gateway.*

*29. A client processor for requesting information from a server in a communications network, the client processor comprising a compression unit configured to receive an upstream request, to compress the received request using an internet driver, thereby generating a compressed upstream request, and to output the compressed upstream request using a connection-oriented communication protocol, wherein client processor is connected to an upstream and a downstream channel, and the compressed upstream request is output on the upstream channel and the requested information is received on the downstream channel and a ratio of downstream traffic to upstream traffic is increased beyond a 20:1 ratio.*

*30. The client processor of claim 29, wherein the compression unit by compressing the upstream request reduces traffic on the upstream channel, thereby increasing a ratio of downstream to upstream traffic beyond a ratio of 20:1.*

*31. The client processor of claim 30, wherein the downstream channel has a substantially larger capacity than the upstream channel.*

*32. The client processor of claim 30, wherein the compression unit compresses the upstream request by using format compression.*

*33. The client processor of claim 32, wherein said format compression is a statistical compression.*

*34. The client processor of claim 32, wherein said format compression is a linear prediction compression.*

*35. The client processor of claim 30, wherein the compression unit compresses the upstream request by intercepting said upstream request prior to the addition of network communications protocol information and generating the compressed request in a manner that the compressed request does not include network communications protocol information.*

*36. The client processor of claim 35, wherein said communications protocol is a TCP/IP.*

*37. The client processor of claim 30, wherein the compression unit compresses the upstream request by replacing a string within the upstream request with a short coded reference.*

*38. The client processor of claim 37, wherein said predetermined string is a web site address contained in a previously output upstream request.*

*39. The client processor of claim 30, wherein the compression unit reduces the number of subsequent requests output from said client.*

*40. The client processor of claim 39, wherein the compression unit reduces the number of subsequent upstream requests by inhibiting generation of automatic upstream requests based on embedded references contained within the information received in response to outputting the compressed upstream request.*

*41. The client processor of claim 39, wherein said client provides criteria to a gateway for generating requests based on the embedded references contained within the information received in response to outputting the compressed upstream request.*

*42. An upstream processor coupled to a client processor via an upstream channel and to a server via a communication network, the upstream processor comprising a decompression unit configured to receive from the client processor a compressed upstream request for information from the server, the compressed upstream request being compressed using an internet driver, wherein a ratio of downstream channel traffic to upstream channel traffic exceeds a ratio of 20:1, and to decompress the compressed upstream request to reconstruct an upstream request from the client, wherein the decompression unit is configured to receive the compressed upstream request according to a connection-oriented communication protocol, wherein said decompression unit is configured to automatically generate a new data request for a given user.*

*43. The upstream processor of claim 42, wherein the decompression unit decompresses the compressed upstream request by using format decompression.*

*44. The upstream processor of claim 43, wherein said format decompression is a statistical decompression.*

*45. The upstream processor of claim 43, wherein said format decompression is a linear prediction decompression.*

*46. The upstream processor of claim 42, wherein the decompression unit decompresses the compressed upstream request by adding network communications protocol information to the compressed request.*

*47. The upstream processor of claim 46, wherein said communications protocol is TCP/IP.*

*48. The upstream processor of claim 42, wherein the decompression unit decompresses the compressed upstream request by replacing a short coded reference within the compressed upstream request with a predetermined string.*

*49. The upstream processor of claim 48, further comprising a user profile database having recorded therein the predetermined string in association with the short coded reference.*

*50. The upstream processor of claim 48, wherein said predetermined string is a web site address contained in a previously received upstream request.*

*51. The upstream processor of claim 42, the decompression unit comprising:*

*means for receiving the information from the server in response to outputting the upstream request;*

*means for generating a request for additional information based on a reference within the received information; and*

*means for outputting the generated request upon said communications network.*

*52. The upstream processor of claim 51, wherein said upstream request is an HTTP request for a web page, the information received from the server is the requested web page, and the additional information is a file referenced by the web page.*

*53. The upstream processor of claim 51, wherein the means for generating the request for the file referenced by the web page is controlled by criteria provided by said client.*

*54. The upstream processor of claim 42, further comprising a storage unit having stored therein a profile of users connected to the upstream gateway.*

*55. In an interactive internet information distribution system in which user stations are connected to the internet by an internet server through an upstream gateway for transmission of information requests to said internet server and downstream gateways for transmission of information from the internet server to the user stations, the improvement wherein each user station includes a processor, said processor including:*

*(a) an internet browser module,*

*(b) internet driver means connected to said internet browser module,*

*(c) compression module connected to said internet driver means for reducing the upstream traffic whereby the ratio of downstream to upstream channel traffic is increased beyond a 20:1 ratio and wherein said upstream gateway includes means for storing a profile of the users connected thereto.*

*56. In an interactive internet information distribution system in which user stations are connected to the internet by an internet server through an upstream gateway for transmission of information requests to said internet server and downstream gateways for transmission of information from the internet server to the user stations, the improvement wherein each user station includes a processor, said processor including:*

*(a) an internet browser module,*

*(b) internet driver means connected to said internet browser module,*

*(c) compression module connected to said internet driver means for reducing the upstream traffic whereby the ratio of downstream to upstream channel traffic is increased beyond a 20:1 ratio and wherein said upstream gateway is adapted to perform protocol overhead functions and includes means for storing a profile of the users connected thereto.*

*57. In an interactive internet information distribution system in which user stations are connected to the internet by an internet server through an upstream gateway for transmission of information requests to said internet server and downstream gateways for transmission of information from the internet server to the user stations, the improvement wherein each user station includes a processor, said processor including:*

*(a) an internet browser module,*

*(b) internet driver means connected to said internet browser module,*

*(c) compression module connected to said internet driver means for reducing the upstream traffic whereby the ratio of downstream to upstream channel traffic is increased beyond a 20:1 ratio and wherein said upstream gateway includes means for automatically generating a new data request for a given user.*

* * * * *